(12) United States Patent
Chen

US007249306B2

(10) Patent No.: US 7,249,306 B2
(45) Date of Patent: Jul. 24, 2007

(54) SYSTEM AND METHOD FOR GENERATING 128-BIT CYCLIC REDUNDANCY CHECK VALUES WITH 32-BIT GRANULARITY

(75) Inventor: Addison Chen, Honolulu, HI (US)

(73) Assignee: NVIDIA Corporation, Santa Clara, CA (US)

( * ) Notice: Subject to any disclaimer, the term of this patent is extended or adjusted under 35 U.S.C. 154(b) by 513 days.

(21) Appl. No.: 10/783,345

(22) Filed: Feb. 20, 2004

(65) Prior Publication Data
US 2005/0193316 A1   Sep. 1, 2005

(51) Int. Cl.
*H03M 13/00* (2006.01)
(52) U.S. Cl. .................. 714/758; 714/700; 714/703
(58) Field of Classification Search ............... 714/700, 714/703, 757, 776, 781, 807, 820; 370/395.1, 370/781, 807, 820, 758
See application file for complete search history.

(56) References Cited

U.S. PATENT DOCUMENTS

| 212,889 | A | | 3/1879 | Bridenthal, Jr. et al. | |
|---|---|---|---|---|---|
| 4,807,111 | A | | 2/1989 | Cohen et al. | 364/200 |
| 4,839,851 | A | | 6/1989 | Maki | 364/900 |
| 5,012,489 | A | | 4/1991 | Burton et al. | 375/8 |
| 5,056,058 | A | | 10/1991 | Hirata et al. | 364/900 |
| 5,161,193 | A | | 11/1992 | Lampson et al. | 380/49 |
| 5,163,131 | A | | 11/1992 | Row et al. | 395/200 |
| 5,195,093 | A | * | 3/1993 | Tarrab et al. | 714/703 |
| 5,307,413 | A | | 4/1994 | Denzer | 380/49 |
| 5,426,694 | A | | 6/1995 | Hebert | 379/242 |
| 5,430,727 | A | | 7/1995 | Callon | 370/85.13 |
| 5,440,551 | A | | 8/1995 | Suzuki | 370/60 |
| 5,455,599 | A | | 10/1995 | Cabral et al. | 345/133 |
| 5,485,460 | A | | 1/1996 | Schrier et al. | 370/94.1 |
| 5,495,480 | A | | 2/1996 | Yoshida | 370/60 |
| 5,499,353 | A | | 3/1996 | Kadlec et al. | 395/445 |
| 5,513,324 | A | | 4/1996 | Dolin, Jr. et al. | 395/200.18 |
| 5,519,704 | A | | 5/1996 | Farinacci et al. | 370/85.13 |
| 5,544,357 | A | | 8/1996 | Huei | 395/600 |

(Continued)

FOREIGN PATENT DOCUMENTS

AU   4595297   5/1998

(Continued)

OTHER PUBLICATIONS

Muller, Raimund, LON-das universal Netzwerk Elektronik 22-1991.

(Continued)

*Primary Examiner*—Guy Lamarre
*Assistant Examiner*—Fritz Alphonse
(74) *Attorney, Agent, or Firm*—Zilka-Kotab, PC

(57) ABSTRACT

A System and Method for generating Cyclic Redundancy Check (CRC) values in a system adapted simultaneously handling a plurality of blocks in parallel is described. Included is a memory or other storage device for storing data blocks, wherein the memory or storage device is adapted to output a plurality of data blocks in parallel. A data bus provides a data path wide enough to accommodate the parallel data blocks and is further coupled to a plurality of CRC cores coupled to the data bus, wherein CRC values are calculated for every combination of data blocks on the data bus. A multiplexer coupled to the CRC cores selects the output of one of the CRC cores based on the number of valid data blocks on the data bus. Once the correct CRC value has been calculated, it is appended to a data segment, comprised of a group of data blocks, for transmission to another device.

13 Claims, 4 Drawing Sheets

U.S. PATENT DOCUMENTS

| | | | | |
|---|---|---|---|---|
| 5,546,453 A | 8/1996 | Hebert | | 379/242 |
| 5,566,170 A | 10/1996 | Bakke et al. | | 370/60 |
| 5,577,105 A | 11/1996 | Baum et al. | | 379/93 |
| 5,577,172 A | 11/1996 | Vatland et al. | | 395/114 |
| 5,577,237 A | 11/1996 | Lin | | 395/555 |
| 5,581,686 A | 12/1996 | Koppolu et al. | | 395/340 |
| 5,596,702 A | 1/1997 | Stucka et al. | | 395/340 |
| 5,598,410 A | 1/1997 | Stone | | 370/469 |
| 5,619,650 A | 4/1997 | Bach et al. | | 395/200.01 |
| 5,621,434 A | 4/1997 | Marsh | | 345/145 |
| 5,625,678 A | 4/1997 | Blomfield-Brown | | 379/93 |
| 5,625,825 A | 4/1997 | Rostoker et al. | | 395/730 |
| 5,634,015 A | 5/1997 | Chang et al. | | 395/309 |
| 5,636,371 A | 6/1997 | Yu | | 395/500 |
| 5,640,394 A | 6/1997 | Schrier et al. | | 370/389 |
| 5,650,941 A | 7/1997 | Coelho et al. | | 364/514 |
| 5,663,951 A | 9/1997 | Danneels et al. | | 370/230 |
| 5,664,162 A | 9/1997 | Dye | | 345/521 |
| 5,666,362 A | 9/1997 | Chen et al. | | 370/420 |
| 5,675,507 A | 10/1997 | Bobo, II | | 364/514 |
| 5,678,060 A | 10/1997 | Yokoyama et al. | | 395/831 |
| 5,680,605 A | 10/1997 | Torres | | 395/603 |
| 5,687,314 A | 11/1997 | Osman et al. | | 395/200 |
| 5,696,899 A | 12/1997 | Kalwitz | | 395/200.1 |
| 5,699,350 A | 12/1997 | Kraslavsky | | 370/254 |
| 5,701,316 A | 12/1997 | Alferness et al. | | 371/53 |
| 5,724,370 A * | 3/1998 | Sferrazza et al. | | 714/807 |
| 5,727,149 A | 3/1998 | Hirata et al. | | 395/200.8 |
| 5,734,852 A | 3/1998 | Zias et al. | | 395/334 |
| 5,734,865 A | 3/1998 | Yu | | 395/500 |
| 5,748,905 A | 5/1998 | Hauser et al. | | 395/200.79 |
| 5,754,540 A | 5/1998 | Liu et al. | | 370/315 |
| 5,754,556 A | 5/1998 | Ramseyer et al. | | 371/10.3 |
| 5,761,281 A | 6/1998 | Baum et al. | | 379/93.29 |
| 5,778,178 A | 7/1998 | Arunachalam | | 395/200.33 |
| 5,790,546 A | 8/1998 | Dobbins et al. | | 370/400 |
| 5,790,676 A | 8/1998 | Ganesan et al. | | 380/23 |
| 5,802,287 A | 9/1998 | Rostoker et al. | | 395/200.8 |
| 5,802,306 A | 9/1998 | Hunt | | 395/200.58 |
| 5,805,816 A | 9/1998 | Picazo, Jr. et al. | | 395/200.53 |
| 5,809,235 A | 9/1998 | Sharma et al. | | 395/200.6 |
| 5,815,516 A | 9/1998 | Aaker et al. | | 371/53 |
| 5,818,935 A | 10/1998 | Maa | | 380/20 |
| 5,826,032 A | 10/1998 | Finn et al. | | 395/200.66 |
| 5,854,750 A | 12/1998 | Phillips et al. | | 364/478.04 |
| 5,870,549 A | 2/1999 | Bobo, II | | 395/200.36 |
| 5,870,622 A | 2/1999 | Gulick et al. | | 395/800.35 |
| 5,872,919 A | 2/1999 | Wakeland | | 395/200.6 |
| 5,877,764 A | 3/1999 | Feitelson et al. | | 345/347 |
| 5,894,557 A | 4/1999 | Bade et al. | | 395/200.58 |
| 5,909,546 A | 6/1999 | Osborne | | 395/200.42 |
| 5,918,051 A | 6/1999 | Savitzky et al. | | 395/683 |
| 5,920,732 A | 7/1999 | Riddle | | 395/876 |
| 5,923,892 A | 7/1999 | Levy | | 395/800.31 |
| 5,935,268 A | 8/1999 | Weaver | | 714/758 |
| 5,935,269 A * | 8/1999 | Kodama et al. | | 714/781 |
| 5,937,169 A | 8/1999 | Connery et al. | | 395/200.8 |
| 5,941,988 A | 8/1999 | Bhagwat et al. | | 713/201 |
| 5,943,481 A | 8/1999 | Wakeland | | 395/200.6 |
| 5,946,487 A | 8/1999 | Dangelo | | 395/705 |
| 5,953,352 A * | 9/1999 | Meyer | | 714/820 |
| 5,966,534 A | 10/1999 | Cooke et al. | | 395/705 |
| 5,968,161 A | 10/1999 | Southgate | | 712/37 |
| 5,974,518 A | 10/1999 | Nogradi | | 711/173 |
| 5,991,299 A | 11/1999 | Radogna et al. | | 370/392 |
| 5,999,974 A | 12/1999 | Ratcliff et al. | | 709/224 |
| 6,014,699 A | 1/2000 | Ratcliff et al. | | 709/224 |
| 6,034,963 A | 3/2000 | Minami et al. | | 370/401 |
| 6,046,980 A | 4/2000 | Packer | | 370/230 |
| 6,049,857 A | 4/2000 | Watkins | | 711/207 |
| 6,061,368 A | 5/2000 | Hitzelberger | | 370/537 |
| 6,061,742 A | 5/2000 | Stewart et al. | | 709/250 |
| 6,076,115 A | 6/2000 | Sambamurthy et al. | | 709/250 |
| 6,078,736 A | 6/2000 | Guccione | | 395/500.17 |
| 6,081,846 A | 6/2000 | Hyder et al. | | 709/250 |
| 6,092,110 A | 7/2000 | Maria et al. | | 709/225 |
| 6,092,229 A | 7/2000 | Boyle et al. | | 714/748 |
| 6,098,188 A | 8/2000 | Kalmanek, Jr. et al. | | 714/746 |
| 6,101,543 A | 8/2000 | Alden et al. | | 709/229 |
| 6,122,670 A | 9/2000 | Bennett et al. | | 709/236 |
| 6,151,625 A | 11/2000 | Swales et al. | | 709/218 |
| 6,157,955 A | 12/2000 | Narad et al. | | 709/228 |
| 6,172,980 B1 | 1/2001 | Flanders et al. | | 370/401 |
| 6,172,990 B1 | 1/2001 | Deb et al. | | 370/474 |
| 6,173,333 B1 | 1/2001 | Jolitz et al. | | 709/240 |
| 6,182,228 B1 | 1/2001 | Boden | | 713/201 |
| 6,185,619 B1 | 2/2001 | Joffe et al. | | 709/229 |
| 6,191,614 B1 * | 2/2001 | Schultz et al. | | 326/41 |
| 6,208,651 B1 | 3/2001 | Van Renesse et al. | | 370/392 |
| 6,226,680 B1 | 5/2001 | Boucher | | 709/230 |
| 6,230,193 B1 | 5/2001 | Arunkumar et al. | | 709/218 |
| 6,233,626 B1 | 5/2001 | Swales et al. | | 710/11 |
| 6,247,060 B1 | 6/2001 | Boucher | | 709/238 |
| 6,247,068 B1 | 6/2001 | Kyle | | 709/328 |
| 6,327,625 B1 | 12/2001 | Wang et al. | | 709/235 |
| 6,330,659 B1 | 12/2001 | Poff et al. | | 712/34 |
| 6,334,153 B2 | 12/2001 | Boucher | | 709/230 |
| 6,341,129 B1 | 1/2002 | Schroeder et al. | | 370/354 |
| 6,345,301 B1 | 2/2002 | Burns et al. | | 709/230 |
| 6,347,347 B1 | 2/2002 | Brown et al. | | 710/23 |
| 6,389,479 B1 | 5/2002 | Boucher | | 709/243 |
| 6,389,537 B1 | 5/2002 | Davis et al. | | 713/187 |
| 6,393,487 B2 | 5/2002 | Boucher | | 709/238 |
| 6,397,316 B2 | 5/2002 | Fesas, Jr. | | 711/200 |
| 6,427,169 B1 | 7/2002 | Elzur | | 709/224 |
| 6,427,171 B1 | 7/2002 | Craft | | 709/230 |
| 6,427,173 B1 | 7/2002 | Boucher | | 709/238 |
| 6,430,628 B1 | 8/2002 | Connor | | 710/5 |
| 6,434,620 B1 | 8/2002 | Boucher | | 709/230 |
| 6,434,720 B1 * | 8/2002 | Meyer | | 714/820 |
| 6,460,080 B1 | 10/2002 | Shah et al. | | 709/224 |
| 6,470,415 B1 | 10/2002 | Starr | | 711/104 |
| 6,530,061 B1 | 3/2003 | Labatte | | 714/807 |
| 6,591,302 B2 | 7/2003 | Boucher | | 709/230 |
| 6,609,225 B1 | 8/2003 | Ng | | 714/781 |
| 6,629,141 B2 | 9/2003 | Elzur et al. | | 709/224 |
| 6,658,480 B2 | 12/2003 | Boucher | | 709/239 |
| 6,687,758 B2 | 2/2004 | Craft | | 709/250 |
| 6,697,868 B2 | 2/2004 | Craft | | 709/230 |
| 6,701,478 B1 * | 3/2004 | Yang et al. | | 714/757 |
| 6,738,874 B2 | 5/2004 | Zsohar | | 711/157 |
| 6,751,665 B2 | 6/2004 | Philbrick | | 709/224 |
| 6,757,746 B2 | 6/2004 | Boucher | | 709/250 |
| 6,807,581 B1 | 10/2004 | Starr | | 709/250 |
| 6,910,095 B2 | 6/2005 | Zsohar | | 711/5 |
| 6,918,019 B2 | 7/2005 | Zsohar | | 711/158 |
| 6,938,092 B2 | 8/2005 | Burns | | 709/230 |
| 6,941,386 B2 | 9/2005 | Craft | | 709/250 |
| 6,965,941 B2 | 11/2005 | Boucher | | 709/230 |
| 6,996,070 B2 | 2/2006 | Starr et al. | | |
| 7,042,898 B2 | 5/2006 | Blightman | | 370/463 |
| 2001/0021949 A1 | 9/2001 | Blightman | | 709/219 |
| 2001/0023460 A1 | 9/2001 | Boucher | | 709/250 |
| 2001/0027446 A1 | 10/2001 | Boucher | | 709/250 |
| 2001/0027496 A1 | 10/2001 | Boucher et al. | | 709/250 |
| 2001/0036196 A1 | 11/2001 | Brightman | | 370/465 |
| 2001/0037397 A1 | 11/2001 | Boucher | | 709/230 |
| 2001/0037406 A1 | 11/2001 | Philbrick | | 709/250 |
| 2001/0047433 A1 | 11/2001 | Boucher | | 709/250 |
| 2002/0055993 A1 | 5/2002 | Shah et al. | | 709/223 |
| 2002/0085562 A1 | 7/2002 | Hufferd et al. | | 370/392 |
| 2002/0087732 A1 | 7/2002 | Boucher | | 709/250 |
| 2002/0091844 A1 | 7/2002 | Craft | | 709/230 |
| 2002/0095519 A1 | 7/2002 | Philbrick | | 709/250 |

| | | | |
|---|---|---|---|
| 2002/0120899 A1 | 8/2002 | Gahan et al. ............... | 714/748 |
| 2002/0147839 A1 | 10/2002 | Boucher ..................... | 709/238 |
| 2002/0156927 A1 | 10/2002 | Boucher ..................... | 709/250 |
| 2002/0161919 A1 | 10/2002 | Boucher ..................... | 709/238 |
| 2002/0163888 A1 | 11/2002 | Grinfeld .................... | 370/235 |
| 2003/0005142 A1 | 1/2003 | Elzur et al. ................ | 709/232 |
| 2003/0005143 A1 | 1/2003 | Elzur et al. ................ | 709/232 |
| 2003/0014544 A1 | 1/2003 | Pettey ....................... | 709/249 |
| 2003/0016669 A1 | 1/2003 | Pfister et al. .............. | 370/392 |
| 2003/0031172 A1 | 2/2003 | Grinfeld .................... | 370/389 |
| 2003/0046330 A1 | 3/2003 | Hayes ....................... | 709/201 |
| 2003/0046418 A1 | 3/2003 | Raval et al. ................ | 709/237 |
| 2003/0056009 A1 | 3/2003 | Mizrachi et al. ............ | 709/245 |
| 2003/0058870 A1 | 3/2003 | Mizrachi et al. ....... | 370/395.52 |
| 2003/0061505 A1 | 3/2003 | Sperry et al. ............... | 713/200 |
| 2003/0066011 A1 | 4/2003 | Oren ......................... | 714/758 |
| 2003/0079033 A1 | 4/2003 | Craft ......................... | 709/230 |
| 2003/0084185 A1 | 5/2003 | Pinkerton | |
| 2003/0095567 A1 | 5/2003 | Lo et al. .................... | 370/466 |
| 2003/0115350 A1 | 6/2003 | Uzrad-Nali et al. ........ | 709/231 |
| 2003/0115417 A1 | 6/2003 | Corrigan .................... | 711/118 |
| 2003/0128704 A1 | 7/2003 | Mizrachi et al. ............ | 370/394 |
| 2003/0140124 A1 | 7/2003 | Burns ....................... | 709/220 |
| 2003/0145101 A1 | 7/2003 | Mitchell et al. ............ | 709/236 |
| 2003/0145270 A1 | 7/2003 | Holt .......................... | 714/766 |
| 2003/0167346 A1 | 9/2003 | Craft et al. ................. | 709/250 |
| 2003/0200284 A1 | 10/2003 | Philbrick et al. ........... | 709/219 |
| 2004/0003126 A1 | 1/2004 | Boucher ..................... | 709/250 |
| 2004/0042458 A1 | 3/2004 | Elzu ......................... | 370/394 |
| 2004/0042464 A1 | 3/2004 | Elzur et al. ............ | 370/395.52 |
| 2004/0042483 A1 | 3/2004 | Elzur et al. ................ | 370/463 |
| 2004/0049580 A1 | 3/2004 | Boyd et al. ................. | 709/226 |
| 2004/0054813 A1 | 3/2004 | Boucher ..................... | 709/250 |
| 2004/0062245 A1 | 4/2004 | Sharp ........................ | 370/392 |
| 2004/0062246 A1 | 4/2004 | Boucher ..................... | 370/392 |
| 2004/0064578 A1 | 4/2004 | Boucher ..................... | 709/236 |
| 2004/0064589 A1 | 4/2004 | Boucher ..................... | 709/250 |
| 2004/0064590 A1 | 4/2004 | Starr ......................... | 709/250 |
| 2004/0073703 A1 | 4/2004 | Boucher ..................... | 709/245 |
| 2004/0078462 A1 | 4/2004 | Philbrick ................... | 709/224 |
| 2004/0088262 A1 | 5/2004 | Boucher et al. ............ | 705/65 |
| 2004/0100952 A1 | 5/2004 | Boucher ..................... | 370/389 |
| 2004/0111535 A1 | 6/2004 | Boucher ..................... | 709/250 |
| 2004/0117509 A1 | 6/2004 | Craft ......................... | 709/250 |
| 2004/0133713 A1 | 7/2004 | Elzur ......................... | 710/52 |
| 2004/0139313 A1 | 7/2004 | Buer et al. ................. | 713/150 |
| 2004/0143734 A1 | 7/2004 | Buer et al. ................. | 713/153 |
| 2004/0153578 A1 | 8/2004 | Elzur ......................... | 709/250 |
| 2004/0158640 A1 | 8/2004 | Philbrick ................... | 709/230 |
| 2004/0158793 A1 | 8/2004 | Blightman ................. | 714/758 |
| 2004/0194000 A1* | 9/2004 | Lin et al. .................... | 714/776 |
| 2004/0240435 A1 | 12/2004 | Boucher ..................... | 370/352 |
| 2005/0055456 A1 | 3/2005 | Chalupsky et al. ......... | 709/233 |
| 2005/0111448 A1 | 5/2005 | Narad ....................... | 370/389 |
| 2005/0122986 A1 | 6/2005 | Starr et al. .................. | 370/412 |
| 2005/0141561 A1 | 6/2005 | Craft ......................... | 370/474 |
| 2005/0147110 A1 | 7/2005 | Connor ...................... | 370/412 |
| 2005/0160139 A1 | 7/2005 | Boucher ..................... | 709/203 |
| 2005/0175003 A1 | 8/2005 | Craft ......................... | 370/389 |
| 2005/0182841 A1 | 8/2005 | Starr ......................... | 709/228 |
| 2005/0187939 A1 | 8/2005 | Krithivas ................... | 707/10 |
| 2005/0190787 A1 | 9/2005 | Kuik et al. ................. | 370/466 |
| 2005/0198198 A1 | 9/2005 | Craft ......................... | 709/217 |
| 2005/0204058 A1 | 9/2005 | Philbrick ................... | 709/238 |
| 2005/0278459 A1 | 12/2005 | Boucher ..................... | 709/250 |
| 2006/0010238 A1 | 1/2006 | Craft ......................... | 709/227 |

FOREIGN PATENT DOCUMENTS

| | | |
|---|---|---|
| AU | 7364898 | 11/1998 |
| AU | 4435999 | 12/1999 |
| AU | 723724 | 9/2000 |
| AU | 0070603 | 3/2001 |
| AU | 734115 | 6/2001 |
| AU | 0741089 | 11/2001 |
| AU | 0228874 | 5/2002 |
| CA | 2265692AA | 5/1998 |
| CA | 2287413AA | 11/1998 |
| CA | 2328829AA | 12/1999 |
| CA | 2265692 C | 8/2001 |
| CN | 1237295 A | 12/1999 |
| CN | 1266512 T | 9/2000 |
| CN | 1305681 T | 7/2001 |
| EP | 1427133 | 6/2004 |
| EP | 1427164 | 6/2004 |
| EP | 1460804 | 9/2004 |
| EP | 1460818 | 9/2004 |
| EP | 1513321 | 3/2005 |
| TW | 447205 B | 7/2001 |
| TW | 448407 B | 8/2001 |
| WO | WO98/21655 | 5/1998 |
| WO | WO 98/50852 | 11/1998 |
| WO | WO 99/65219 | 12/1999 |
| WO | WO00013091 A1 | 3/2000 |
| WO | WO 01/13583 | 2/2001 |
| WO | WO 01/28179 | 4/2001 |
| WO | WO 02/39302 | 5/2002 |
| WO | WO 02/059757 | 8/2002 |
| WO | WO 02/086674 | 10/2002 |
| WO | WO 03/021443 | 3/2003 |
| WO | WO 03/021447 | 3/2003 |
| WO | WO 03/021452 | 3/2003 |
| WO | WO 2004/021143 | 3/2004 |
| WO | WO 2004/021150 | 3/2004 |
| WO | WO 2004/021626 | 3/2004 |
| WO | WO 2004/021627 | 3/2004 |
| WO | WO 2005/057945 | 6/2005 |
| WO | WO 2005/067257 | 7/2005 |
| WO | WO 2005/067258 | 7/2005 |
| WO | WO 2005/091826 | 10/2005 |

OTHER PUBLICATIONS

Abbot, Mark B.; Peterson, Larry L., "Increasing Network Trhoguhput by Integrating Protocol Layers" IEEE 1993.
Wright, Maury, Low-Cost Control LANs Add Automation to Homes, Autos, and Offices EDN-Technology Jul. 20, 1992.
Preston, David J., "Internet Protocols Migrate To Silicon For Networking Devices" Electronic Design Apr. 14, 1997.
Chesson, Greg, "The Protocol Engine Project" Technology Focus Sep. 1987.
Chesson, Greg, "Proceedings of the Summer 1987 USENIX Conference" USENIX Association Jun. 8-12, 1987.
G. Chesson and L. Green, "XTP Protocol Engine VLSI for Real-Time LANS" EFOC/LAN Jun. 29-Jul. 1, 1968.
Wayner, "Sun Gambles on Java Chops", Bytes, Nov. 1996.
Raz, "Real Time Program Language Accelerator", WO 98/21655, May 1998.
Agrawal et al. "Architecture and Design of the Mars Hardware Accelerator", ACM 1987, pp. 101-107.
Case, "Implementing the Java Virtual Machine", Microprocessor Report, Mar. 1996.
Kitadeya et al., "Matsushita Launches Web TV Internet Connection Terminal", http://www.mei.co.jp/corp/news/offiicial.data/data.dir/en981112-1/en981112-1.html, Nov. 1998.
iReady Product Data Sheet, Internet Tuner.
Johnson et al. , "Internet Tuner", New Media News, http://www.newmedianews.com.020197/ts.sub-_inettuner.html, Jan. 1997.
Kelly, T., "Cheap Internet Hardware that Fits in Everything", ZDNet, http://www.zdnet.co.uk/news/1998/44/ns-5998.html, Nov. 1998.
8802-3:2000 ISO/IEC Information Technology, http://www.computer.org/cspress/CATALOG/st01118.htm.
INCITS: Development work conducted in t10-I/O Interface-Lower Level Sep. 30, 2002 Weber, Ralph O.

Stevens, Richard W., "TCP/IP Illustrated Volume" Addison-Wesley Professional Computing Series.
Abbot, Mark B., and Peterson, Larry L., "Increasing Network Throughput by Integrating Protocol Layers" IEEE 1993.
Wright, Maury, "Low-Cost Control LANs Add Automation to Homes, Autos, and Offices" EDN Jul. 20, 1992.
Preston, David J., "Internet Protocols Migrate to Silicon For Networking Devices" Electronic Design Apr. 14, 1997.
Muller, Raimund, "LON—das universelle Netzwerk" Electronik 22/1991.
Rang, Michael; Tantawy, Ahmed, "A Design Methodology for Protocol Processors" IEEE 1995.
Banks, David and Prudence, Michael, "A High-Performance Network Architecture for a PA-RISC Workstation" IEEE Journal vol. II, No. 22 Feb. 1993.
Steenkiste, Peter, "A High-Speed Network Interface for Distributed-Memory Systems: Architecture and Applications" ACM Transactions on Computer Systems, vol. 15, No. 1 Feb. 1997.
Doumenis, Gr.A., Konstantoulakis, G.E., Reisis, D.I.and Stassinopoulos, G.I. " A Personal Computer Hosted Terminal Adapter For The Broadband Integrated Services Digital Network and Applications" National Technical University of Athens, Greece.
Womack, Lucas; Mraz, Ronald; Mendelson,, Abraham, "A Study of Virtual Memory MTU Reassembly withing the PowerPC Architecture" IEEE 1997.
Steenkiste, Peter, "A Systematic Approach to Host Interface Design for High-Speed Networks" IEEE Mar. 1994.
Wittie, Larry D., Ma, Fanyuan, "A TCP/IP Communication Subsystem in Micros" IEEE 1987.
Dalton, Chris; Watson, Greg; Banks, David; Calamvokis, Costas; Edwards, Aled; Lumley, John, "Afterburner: A Network-independent card provides architectural support for high-performance protocols" IEEE Jul. 1993.
Gupta, Pankaj; McKeown, Nick, "Algorithms for Packet Classification" IEEE Network Mar./Apr. 2001.
Clark, David D.; Romkey, John; Salwen, Howard, "An Analysis of TCP Processing Overhead" IEEE 1988.
Clark, David D.; Jacobson, Van; Romkey, John; Salwen, Howard, "An Analysis of TCP Processing Overhead" IEEE Jun. 1989.
Goloi, W.K.; Behr, P. "An IPC Protocol and Its Hardware Realization For A High-Speed Distributed Multicomputer System" IEEE 1981.
Ames, Richard, "Building an Embedded Web Server from Scratch" Circuit Cellar INK Feb. 1998.
Legg, John, "Choosing and implementing an embedded TCP/IP Stack" Electronic Product Design Jan. 1999.
Orphanos, George; Birbas, Alexios; Petrellis, Nikos; Mountzouris, Ioannis; Malataras, Andreas, "Compensating for Moderate EffectiveThroughput at the Desktop" IEEE Communication Magazine Apr. 2000.
Yocum, Kenneth G.; Chase, Jeffrey S.; Gallatin, Andrew J.; Lebeck, Alvin R., Cut-Through Delivery in Trapeze: An Exercise in Low-Latency Messaging IEEE 1997.
Varada, S.; Yang, Y.; Evans, D., "Data and Buffer Management in ATM Systems" TranSwitch Corporation.
Bonjour, Dominique; de Hauteclocque, Gaelle; le Moal, Jacques, "Design and Application of ATM LAN/WAN Adapters" IEEE 1998.
Kim, Chan; Jun, Jong-Jun; Park, Yeong-Ho; Lee, Kyu-Ho; Kim, Hyup-Jong, "Design and Implementation of a High-Speed ATM Host Interface Controller" Electronics and Telecommunications Research Institute, Korea.
Steenkiste, Peter, "Design, Implementation, and evaluation of a Single-copy Protocol Stack" Software—Practice and Experience, vol. 28, Jun. 1998.
Meleis, Hanafy E.; Serpanos, Dimitios, N., "Designing Communication Subsystems for High-Speed Networks" IEEE Network Jul. 1992.
Doumenis, Gr. A.; Reisis, D.I.; Stassinopoulos, G.I., "Efficient Implementation of the SAR Sublayer and the ATM Layer in High-Speed Broadband ISDN Data Terminal Adapters" IEEE 1993.
Mora, F.; Sebastia, A., "Electronic Design of a High Performance Interface to the SCI Network" IEEE 1998.
Eady, Fred, "Embedded Internet Part 2: TCP/IP and a 16-Bit Compiler" Embedded PC Jun. 1999.
Shivam, Piyush; Wyckoff, Pete; Panda, Dhabaleswar, "EMP: Zero-copy OS-bypass NIC-driven Gigabit Ethernet" SC2001 Nov. 2001, Denver CO, USA.
Mansour, Mohammad; Kayssi, Ayman, "FPGA-Based Internet Protocol Version 6 Router" IEEE 1998.
Smith, Jonathan M.; Traw, C. Brendan S., "Giving Applications Access to Gb/s Networking" IEEE Network Jul. 1993.
Traw, C. Brendan S.; Smith, Jonathan M., "Hardware/Software Organization of a High-Performance ATM Host Interface" IEEE 1993.
Nagata, Takahiko; Hosoda, Yamashita, Hiroyuki, "High-Performance TCP/IP/ATM Communication Board" NTT Information and Communication Systems Laboratories 1998.
Nagata, Takahiko; Hosoda, Yasuhiro; Yamahsita, Hiroyuki, "High Performance TCP/IP/ATM Communication Boards:Driving Force for Various Multimedia Services" vol. 9 No. 6 Nov. 1997.
Jolitz, William Frederick, "High-Speed Networking: Header prediciton and forward-error correction for very high-speed data transfer" Dr. Dobbs Journal, Aug. 1992.
Chiswell, Dave "Implementation Challenges for 155Mbit ATM Adapters" ISBN# 0-7803-2636-9.
Wright, Maury "Intelligent Ethernet Boards" EDN Junl. 23, 1988.
Preston, David "Internet Protocols Migrate to Silicon For Networking Devices" Electronic Design Apr. 14, 1997.
Ivanov-Loshkanov, V.S.; Sevast'yanov, S.F., Semenov, M.N., "Network Microprocessor Adapter" Avtmatika i Vyshislitel'naya Tekhnika vol. 17 No. 5 pp. 25-28, 1983.
Druschel, Peter; Abbot, Mark B.; Pagels, Michael A.; Peterson, Larry L., "Network Subsystem Design" IEEE Network Jul.1993.
Huange, Jau-Hsiung; Chen, Chi-Wen, "On Performance Measurements of TCP/IP and its Device Driver" IEEE 1992.
Siegel, Martin; Williams, Mark; Robler, Georg, "Overcoming Bottlenecks in High-Speed Transport Systems" IEEE 1991.
Neufeld, Gerald W.; Ito, Mabo Robert; Goldberg, Murray; McCutcheon, Mark J.; Ritchie, Stuart, "Parallel Host Interface for an ATM Network" IEEE Network Jul. 1993.
Maly, K.; Khanna, K.; Kukkamala, R.; Overstreet C.M.; Yerraballi, R.; Foundriat, E.C.; Madan, B., "Parallel TCP/IP For Multiprocessor Workstations" High Performance Networking, IV, 1993 IFIP.
Laskman, T.V.; Madhow, U., "Performance Analysis of Window-based Flow Control using TCP/IP:Effect of High Bandwidth Delay Products and Random Loss" High Performance Networking V. 1994 IFIP.
Ramakrishnan, K.K., "Performance Considerations in Designing Network Interfaces" IEEE Journal1993.
Camarda, P.; Pipio, F.; Piscitelli, G.; "Performance evaluating of TCP/IP implementations in end systems" IEE Proc-Computer Digital Tech. vol. 146 No. 1 Jan. 1999.
Toyoshima, Kan; Shirakawa, Kazuhiro; Hayashi, Kazuhiro, "Programmable ATM Adapter: Rapid Prototyping of Cell Processing Equipment for ATM Network" IEEE 1997.
Blumrich, Matthias A.; Dubnicku, Cezary; Felton, Edward W.; Li, Kai, "Protected, User-level DMA for the SHRIMP Network Interface" IEEE 1996.
Feldmeier, David C.; McAuley, Anthony J.; Smith, Jonathan M., Bakin, Deborah S.; Marcus, William S.; Raleigh, Thomas M., "Protocol Boosters" IEEE 1998.
Marcus, William S.; Hadzic, Ilija; McAuley, Anthony J.; Smith, Jonathan M., "Protocol Boosters: Applying Programmability to Network Infrastructures" IEEE Communications Magazine Oct. 1998.
Korablum, Deborah F., "Protocol Implementation and Other Performance Issues for Local and Metropolitan Area Networks" EEE 1988.
Dittia, Zubin D.; Parulkar, Guru M; Jr., Jerome R. Cox, "The APIC Approach to High Performance Network Interface Design: Protect4ed DMA and Other Techniques" IEEE 1997.
Rutsche, Erich, "The Architecture of a Gb/s Multimedia Protocol Adapter" ACM SIGCOMM Computer Communication Review.

Moldeklev, Kjersti; Klovning, Espen; Kure, Oivind, "The effect of end system hardware and software on TCP/IP throughput performance over a local ATM Network".

Kanakia, Hermant; Cheriton,, David R., "The VMP Network Adapter Board (NAB) High Performance Network Communication for Multiprocessors" ACM 1988.

Chandrammenon, Grish P.; Varghese, George, "Trading Packet Headers for Packet Processing" IEEE 1996.

Nielson, Dr. Michael J.K., "TURBOchannel" IEEE 1991.

New Media News, www. newmedianews.com/02197/ts_inettuner.html.

Kelly, T. "Cheap Internet Hardware that Fits in Everything" ZDNet, www.zdnet.co.uk/news/1998/77/ns-5998.html.

Kitadeya et al. "Matsushita Launches WebTV Internet Connection Terminal" www.mei.co.jp/corp/news/official.data.dir/en981112-1/en981112-1html.

eady Product Data Sheet, Internet Tuner.

Luijten, Ronald P., "An OC-12 ATM Switch Adapter Chipset" 1998 IEEE.

"Less-Numerical Algorithms", Ch. 20 p. 888-895.

"Storage Networking Industry Association" iSCSI Building Blocks for IP Storage Networking, www.ipstorage.org.

* cited by examiner

SYSTEM AND METHOD FOR GENERATING 128-BIT CYCLIC REDUNDANCY CHECK VALUES WITH 32-BIT GRANULARITY

FIELD OF THE INVENTION

This invention relates to the field of error detection in data transmission and more particularly to a System and Method for Generating Cyclic Redundancy Check (CRC) values in a system having a data bus adapted simultaneously handling a plurality of blocks in parallel.

BACKGROUND OF THE INVENTION

As the internet and computer networking continue to evolve, data transmission speeds are increasing as well as the volume of data transmitted. The increase in data traffic is occurring in Local Area Networks (LANs) based on Ethernet and other transport mechanisms such as Wide Area Networks (WANs), and Storage Area Networks (SANs) which could use Ethernet or any of a number of data transport mechanisms. Similarly, the amount of data moving through Internet Protocol (IP) based networks such as the internet continues to grow substantially.

Accordingly, users face a growing need for new ways to store and maintain their data. Today's technology offers three basic storage options: Direct Attached Storage (DAS), Network Attached Storage (NAS) and Storage Area Networks (SAN).

In its most basic form, Direct Attached Storage consists of a disk drive directly attached to a personal computer or server. One of the most common methods of transferring data between a hard drive and its associated personal computer or server is the Small Computer Systems Interface (SCSI). Other methods, such as SATA and IDE are well known.

The SCSI protocol uses commands to transfer blocks of data, which are low level, granular units used by storage devices, as opposed to LANs, which typically use file based methods for transferring data. The overall operation and an architectural description of the SCSI protocol is available from the American National Standards Institute (ANSI), the specific specification having the designation ANSI/INCITS 366-2003, titled *Information Technology—SCSI Architecture Model—2 (SAM-2)*, herein incorporated reference, and herein referred to as the SCSI Specification.

As internet traffic and storage needs have grown, there is a growing convergence between storage devices, protocols, and IP based transport mechanisms. For example, current SCSI storage devices are designed to work over a parallel cable having a maximum cable length of 12 meters, While IP based transport mechanisms have no data transmission distance limitation.

At the present time, the storage industry and the various industry entities responsible for developing and maintaining the various Internet Protocols are working together to develop standards to enable SCSI based data transfers over the internet. Specifically, the IP Storage (IPS) Working Group of the Internet Engineering Task Force (IEF) is in the process of finalizing a specification for encapsulating SCSI commands in the known TCP/IP protocol. The Internet SCSI (iSCSI) protocol for block storage is predicated on standard Ethernet transports. The iSCSI protocol defines the rules and processes to transmit and receive block storage data over TCP/IP networks, both of which employ error detection techniques to ensure data integrity during transmission.

iSCSI replaces the parallel SCSI direct cabling scheme with a network fabric. iSCSI is transport independent and will support any media that supports TCP/IP. Servers and storage devices that support iSCSI connect directly to an existing IP switch and router infrastructure. iSCSI enables SCSI-3 commands to be encapsulated in TCP packets and delivered reliability over IP networks. The iSCSI specification is complete and undergoing final ratification within the IETF. The current iSCSI specification is available from the IETF under the designation draft-ietf-ips-iscsi-20.txt, dated Jan. 19, 2003, and herein referred to as the iSCSI Specification. iSCSI network interfaces under development will be capable of transferring data over the internet in speeds approaching 20 Gbits/sec. The iSCSI protocol is just one example of a network storage protocol, which may employ the System and Method of the present invention, although those skilled in the art will appreciate that the System and Method of the present invention is useful in any type of data transfer protocol where CRC checksums are useful or required.

Cyclic Redundancy Check (CRC) techniques are used to verify the validity of data contained in data blocks or data segments transferred between devices, such as a storage device and a computer or server system, as described above. In other applications, CRC techniques may be used in data communication systems to verify the validity of data blocks transmitted between devices that are geographically distributed, such as those which employ the Internet as a transmission media, or in systems where data is transmitted over conventional telephone lines using modems.

A variety of CRC techniques are well known and have become widely deployed because of their highly reliable error detection capabilities, speed and relative ease of implementation. For example, a description of CRC applications may be found in the text: Press, W. H.; Flannery, B. P.; Teukolsky, S. A.; and Vetterling, W. T. "Cyclic Redundancy and Other Checksums." Ch. 20.3 in *Numerical Recipies in Fortran: the Art of Scientific Computing, $2^{nd}$ ed.*, Cambridge, England: Cambridge University Press, pp. 888–895, 1992. A further example of a 32-bit CRC application is described in the industry standard publication designated: IEEE 802.3, 2000 Edition, CSMA/CD (ISO/IEC 8802-3: 2000(E), which describes the requirements for what is commonly referred to as "Fast Ethernet".

CRC values can be appended to a variety of data types ranging from blocks of data, having a predefined number of bits, to predefined groups of blocks, known as segments. CRC values are determined according to a predetermined algorithm which is known in both an initiator system and a target system. The actual CRC value is typically a function of the specific algorithm used, the actual data communicated, as well as the CRC value used in a prior communication session.

CRC algorithms can vary in complexity from those based on simple binary arithmetic to more complex algorithms using polynomials and some form of binary division or multiplication. The overall reliability of any given CRC algorithm is a function of the complexity of the algorithm used as well as the number of bits used in calculating the CRC value. For example, these algorithms may not detect an error for an N-bit checksum, because there is a possibility that $\frac{1}{2}^N$ of random blocks will have the same checksum for inequivalent data blocks. However, as the value of N increases, the probability that two inequivalent blocks will have the same CRC value decreases. If N is sufficiently large, the probability of a detecting an error drops to a statistically insignificant value. Further, algorithms based on polynomial division or multiplication are less susceptible to error than those based on simple addition or subtraction.

In general, CRC values are generated using binary or Modulo-2 arithmetic. Therefore, the multiplication process used to generate a CRC value in a complex polynomial is merely a sequence of logical ANDs and XORs which can be readily implemented with well known hardware or software techniques. To detect errors in any given data communication, a CRC value is calculated prior to data transmission and appended to a data packet or segment. When the data packet or segment is received, the CRC value is recalculated, and compared to the CRC value appended to the data packet or segment. If the two CRC values match, no errors occurred during data transmission. If the two CRC values do not match, an error has occurred, and re-transmission is required.

SUMMARY OF THE INVENTION

A System and Method for generating Cyclic Redundancy Check (CRC) values in a system for adapted simultaneously handling a plurality of blocks in parallel is described. Included is a memory or other storage device for storing data blocks, wherein the memory or other storage device is adapted to output a plurality of data blocks simultaneously. A data bus, coupled to the memory, provides a data path wide enough to accommodate the parallel data blocks and is further coupled to a plurality of CRC cores, wherein each CRC core calculates a CRC value for every combination of valid data blocks on the data bus. A multiplexer coupled to the CRC cores selects the output of one of the CRC cores based on the number of valid data blocks on the data bus. The selected CRC value is then appended to a data segment for transmission to another device.

DETAILED DESCRIPTION OF THE INVENTION

Figure 1:
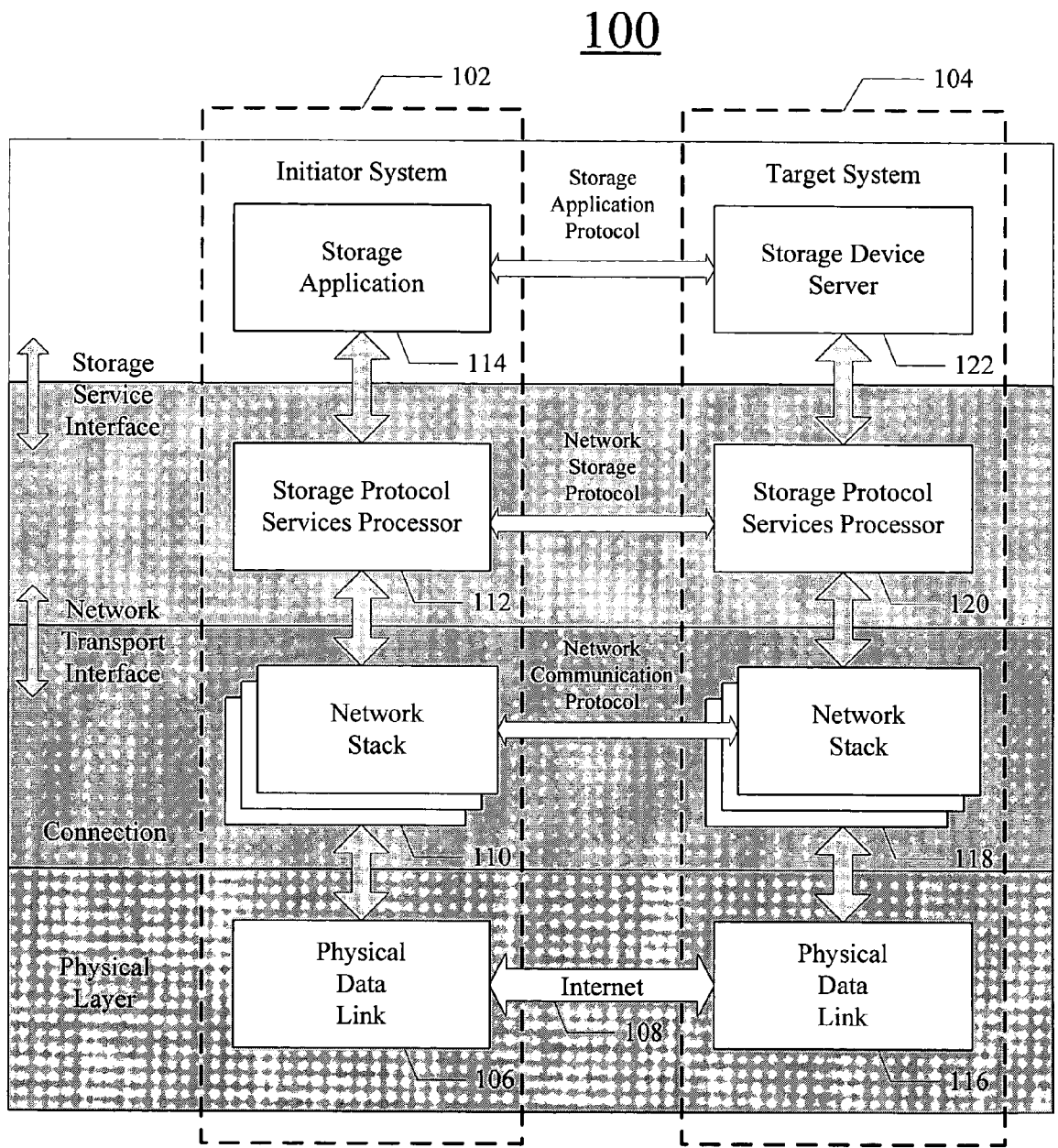
FIG. 1 is a diagram showing the protocol stack in a typical Data Network System.

The System and Method for Marker insertion of the present invention is useful in data transmission systems such as those based on the TCP/IP protocol. FIG. 1 shows a Data Network 100, which may employ standard networking protocols such as TCP/IP as well as a storage protocol such as SCSI. The Data Network 100 comprises and Initiator System 102 and a Target System 104. The Initiator System 102 includes a Physical Data Link 106, which provides a physical connection to the Internet 108 via any type of physical connection, such as an Ethernet connection common in most Local Area Networks. The Physical Data Link 106 is coupled to a Network Stack 110, which exchanges data with the Physical Data Link 106 in accordance with a Network Communication Protocol such as TCP/IP. The Network Stack 110 is further coupled to a Storage Protocol Services Processor 112 that exchanges data with Network Stack 110. The Storage Protocol Processor 112 processes requests from a Storage Application 114 and encapsulates or decodes packets as requested by Storage Application 114 in accordance with a predetermined data storage protocol such as SCSI.

The Target System 104 includes a set of components that complement those of the Initiator System 102. Specifically, the Target System 104 comprises a Physical Data Link 116, a Network Stack 118, a Storage Protocol Services Processor 120 and a Storage Device Server 122, wherein each of the respective devices in Data Network 100 at each layer are in logical communication with each other. For example, each of the respective Network Stacks 110, 118 are in cooperative communication through the Physical Data Links 106, 116 to establish and maintain network connections, via a Network Communication Protocol such as TCP/IP over the Internet 108, by addressing the appropriate target and destination IP addresses, and opening ports and sockets during an active connection. Similarly, the respective Storage Protocol Services Processors 112, 120 are in logical communication with each other in establishing connections, negotiating parameters and exchanging Data Communication Packets such as those specified in the iSCSI specification. Finally, the Storage Application 114 is in logical communication with the target Storage Device Server 122 in the exchange of data blocks, such as those defined in the SCSI specification.

In operation, the respective Initiator and Target systems 102, 104 operate as typical host and storage devices that are logically coupled with a network connection and through the various service and transport layers below. Thus, any distance limitations imposed by the physical characteristics of the directly connected storage interfaces are eliminated. Further, in many network configurations, Personal Computers, Servers and various Network Attached storage devices will include complementary Target and Initiator Systems. However, the present invention is particularly useful in the context of one device initiating a data communication session with another.

Figure 2:
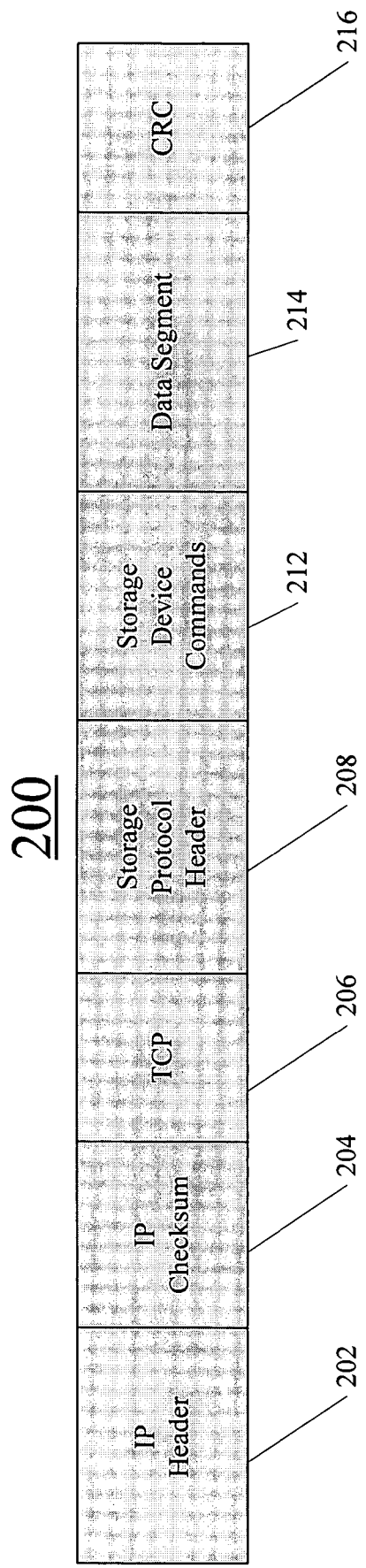
FIG. 2 is a diagram of a data structure of typical TCP/IP Data Communication Packet, which includes an appended CRC value.

FIG. 2 shows an exemplary Data Communication Packet 200 for transmission via TCP/IP according to a network storage protocol such as the one described in the iSCSI Specification. As shown, the Data Communication Packet 200 includes an IP Header 202 and a TCP header 206 which are defined in accordance with the industry standard TCP/IP protocol. IP and TCP headers are used in establishing connections and include parameters such as a source address, destination address, and port identification. The TCP/IP protocol also provides for the insertion of an IP checksum 204 between the IP Header 202 and TCP Header 206 that may be used for error detection while establishing a connection. Following the TCP Header 204 are a Storage Protocol Header 208 and Storage Device Commands 212. Data segment 214 comprises a group of data blocks requested from a Storage Application 114, which are read from Storage Device Server 122. A CRC value 216 is appended to the end of Data Communication Packet 200 for error detection. The Storage Protocol Header 208 may include a number of parameters such as frame length, frame identifier, communication session options or other desired information. The storage device commands may include standard commands such as those used in directly attached SCSI systems.

As will be described in greater detail below, the CRC value 216 is calculated based on a predetermined CRC algorithm as well as the contents of Data Segment 214. Since the Network Storage Protocol Header 208, Storage Device Commands 212, and Data Segment 214 are exchanged between Initiator and Target Systems as data blocks within a TCP/IP connection, the physical transport layer becomes somewhat irrelevant. The Network Storage Protocol and Storage Device information appear as nothing more than a string of binary values sent over a physical layer. As such, the entire internet infrastructure is available as a physical transport mechanism for data block transfers.

Figure 3:
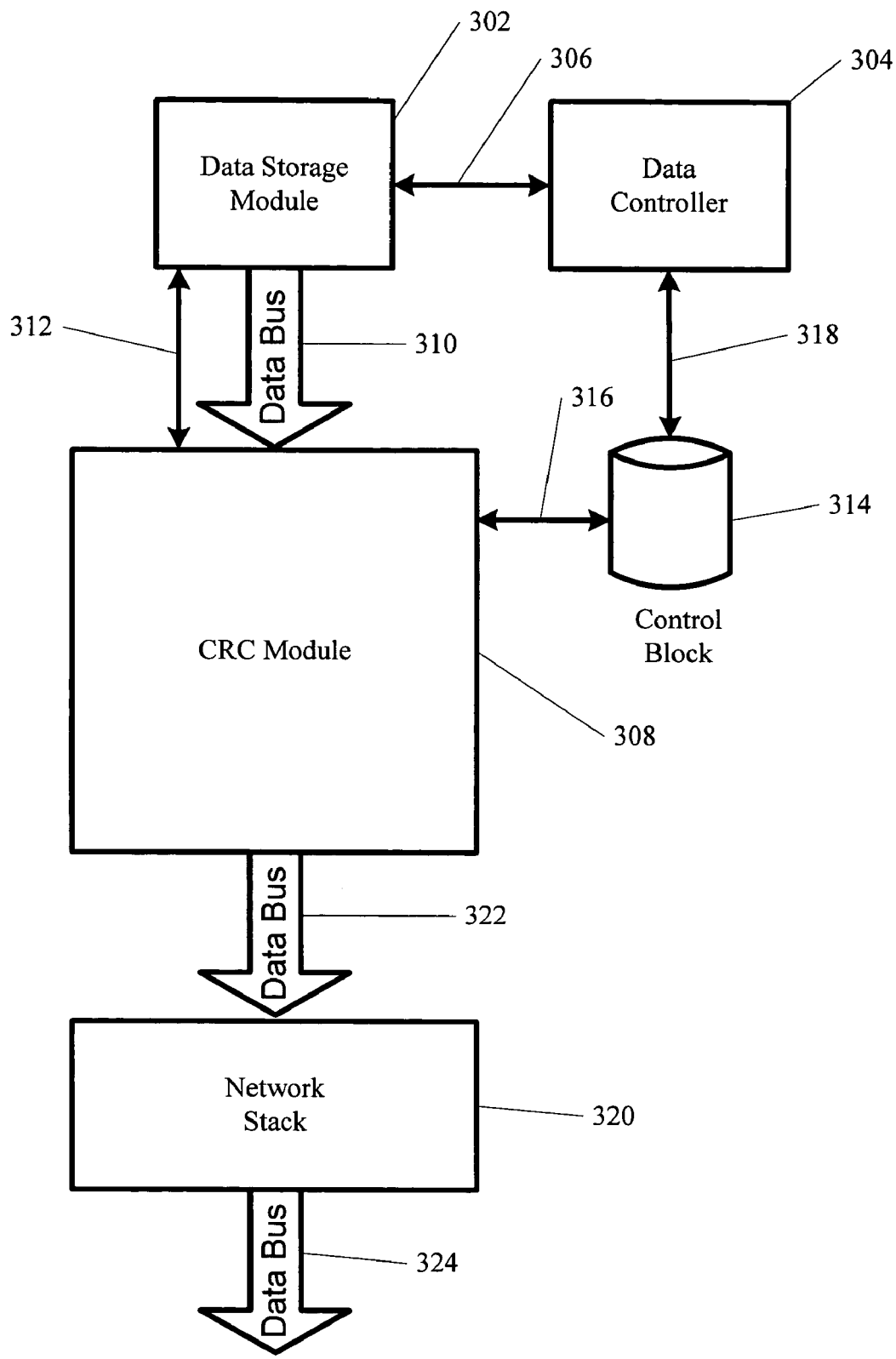
FIG. 3 is a system diagram a Data Transmission System which is adapted for use in accordance with the principles of the Present Invention.

Referring now to FIG. 3, a system diagram of Data Transmission System 300 is shown. Those skilled in the art will appreciate that the Data Transmission System 300 may be implemented in any of a number of ways including implementation entirely in software or hardware, or any combination thereof. As data transmission rates continue to increase, it is becoming increasingly difficult for typical Central Processing Units found in Personal Computers and Servers to manage data traffic without having a performance impact on total system performance. Thus, it is becoming increasingly common for data transmission systems such as those based in the iSCSI Specification to be implemented in devices known as Transmission Offload Engines.

An overview of various Transmission Offload schemes is available from the Storage Networking Industry Association (SNIA). For example, a Whitepaper published by the SNIA IP Storage Forum and entitled *iSCSI Building Blocks for IP Storage Networking* discusses various iSCSI implementations and Transmission Offload Engines. The Data Transmission System 300 is suitable for use as an implementation of Target System 104.

In the Data Transmission System 300, a Data Storage module 302 is used to store data in a host system such as a Personal Computer, Server or Network Storage Device and may include one or several hard disk drives or any type of random access memory. The Data Storage Module 302 is coupled to Data Controller 304 with Memory Control Bus 306. Data Storage Module 302 is further coupled to CRC Module 308 through Data Bus 310 and Control Bus 312. Control Bus 312 is used to synchronize transfers of data blocks between the Data Storage Module 302 and CRC Module 308. Control Block 314 is cooperatively coupled to CRC Module 308 with Control Bus 316. Control Block 314 is further coupled to Data Controller 304 with Control Bus 318. The specific operation of the various control busses 306, 312, 316 and 318, Data Controller 304, Control Block 314 and CRC Module 308 is discussed in further detail below.

The output of CRC Module 308 is coupled to the Network Stack 320 with Data Bus 322 for generating a CRC value and appending it to the Data Communication Packet 200 described in conjunction with FIG. 2. Once the Data Communication Packet 200 has been aggregated in Network Stack 320, it is then sent to the Physical Data Link 116 via Data Bus 324.

Figure 4:
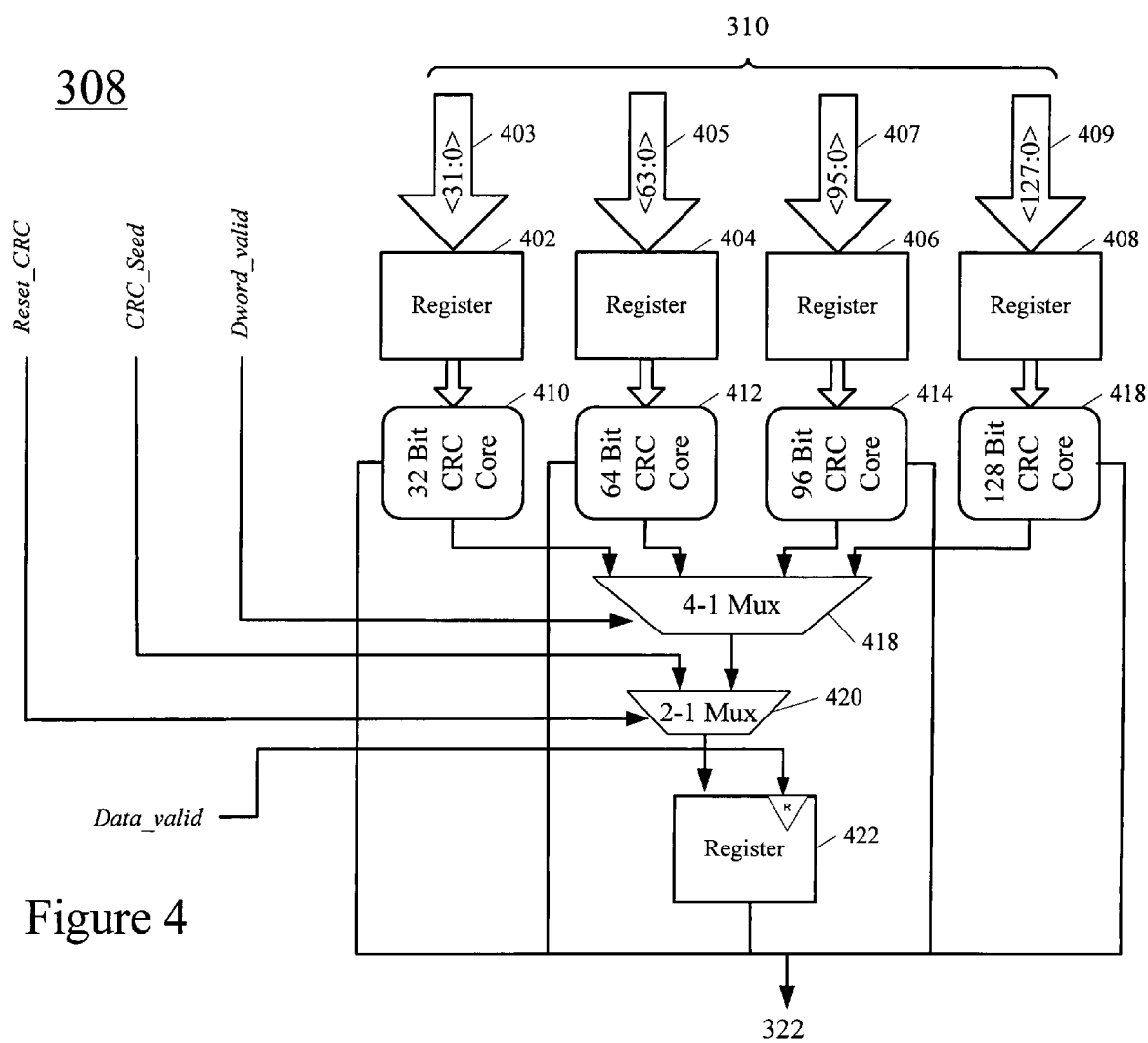
FIG. 4 is a schematic diagram of the CRC Module of FIG. 3.

Referring now to FIG. 4, the CRC Module 308 is shown in detail. In the preferred embodiment of the present invention, Data Bus 310 is 128 bits wide, and can accommodate four 32-bit data blocks simultaneously. In other words, Data Bus 310 is capable of accommodating data paths of 32-bits, 64-bits, 96-bits or 128 bits, as required during a transfer of data from Data Storage Module 302, as represented by Data Paths 403, 405, 407 and 409, respectively. Typical block based data storage systems, such as the one described in the SCSI specification use a 32-bit wide data path, and data transfers occur on a block-by-block basis. The present invention achieves a substantial improvement in performance over prior implementations by providing for transfers of a plurality of data blocks in parallel. While the preferred embodiment of the present invention is described in the context of a 128-bit wide data bus, those skilled in the art will appreciate that the Data Bus 310 could easily be adapted to accommodate much wider or narrower data paths, as required by a given implementation.

Data Bus 310 is coupled to a plurality of registers 402–408, each of which is adapted to temporarily store valid data blocks present on Data Bus 310, in general, and on more specifically on Data Paths 403, 405, 407, and 409, respectively. In the embodiment shown, Data bus 310 is implemented with a 128-bit data bus with Dath Path 409 handles data lines designated <127:0>. Register 402 is physically coupled to Data Path 403 and handles data lines <31:0>; Register 404 is physically coupled to Data Path 405 and handles data lines <63:0>; Register 406 is physically coupled to Data Path 407 and handles data lines <95:0>; and Register 408 is physically coupled to Data Path 409 and handles data lines <127:0>. Therefore, a register is associated with each of a plurality of Data Paths for temporarily storing each possibility of valid 32-bit data blocks on Data Bus 310.

In the course of any given data transmission, the final block of the data transmission may occur on the boundary of any of the above possibilities. For example, as data blocks are read from Data Storage Module 302, the end of the data transmission may be a single 32-bit block, or may be as many as four 32-bit blocks. Each of the respective Registers 402–408 is coupled to a corresponding CRC core specifically adapted for each possibility of valid data blocks on Data Bus 310. As shown in FIG. 4, Register 402 is coupled to 32-bit CRC core 410; Register 404 is coupled to 64-bit CRC core 412; Register 406 is coupled to 96-bit CRC core 414; and Register 408 is coupled to 128-bit CRC core 416. Therefore, a CRC core is provided for every instance or granularity of valid data blocks on Data Bus 310.

CRC module 308 operates in conjunction with memory control signals dword_valid and data_valid which are generated by Data Controller 304, and control signal reset_CRC and CRC_seed which are generated within Control Block 314. During a transfer from Data Storage module 302, data blocks are read into the respective registers 402–408. Control signal dword_valid is coupled to 4-1 Multiplexer 418, and is a 2-bit value that indicates which of Registers 402–404 contain valid data blocks. For each data transfer cycle, CRC cores 410-416 calculate CRC candidates for all four possibilities that valid data may be present in Registers 402–408. The correct candidate is selected in Multiplexer 418 based on the value of dword_valid, which is calculated with a decrementing counter that is initialized prior to data transfer from Data Storage Module 302, and is decremented based on the number of valid data blocks on Data Bus 310. In any given data transfer, it is assumed that all 128-bits are valid until the last set of data blocks are transferred. The control CRC_seed is coupled to 2-1 Multiplexer 420 and is used to promote a CRC seed at the end of each data transmission. When the end of a data transmission is reached, CRC_Seed is asserted at Multiplexer 420 so that the current CRC value is fed back to the respective CRC cores for generating a new CRC value for the next data transmission, upon assertion of the control signal reset_CRC.

Once a CRC value has been determined, it is latched into Register 422 upon assertion of the control signal data_valid, and is output to Data Bus 322 for appending to the a data packet in Network Stack 320.

While the various embodiments described above have been described with reference to Data transmission Systems, it should be understood that they have been presented by way of example only, and not limitation. Thus, the breadth and scope of a preferred embodiment should not be limited by any of the above-described exemplary embodiments, but should be defined only in accordance with following claims and their equivalents.

What is claimed is:

1. A method IP calculating CRC values in a data transmission system having a data bus wherein the number of data blocks containing valid data on said data bus is variable, said number of data blocks comprising a group, and at least one of said groups comprising a data segment, said method comprising the steps of:
   a) determining a number of data blocks on a data bus;
   b) calculating a CRC value in accordance with a predetermined algorithm that accommodates an Internet small computer system interface (iSCSI) protocol, as determined by said number of data blocks, utilizing a transport offload engine (TOE) including a physical data link that provides a physical connection to the Internet, a network stack in communication with said physical data link utilizing a TCP/IP protocol, a storage protocol services processor in communication with said network stack for exchanging data with said network stack, processing requests from a storage application, and encapsulating or decoding packets as requested by said storage application in accordance with said iSCSI protocol;

c) appending said CRC value to said data segment; and d) transmitting said data segment utilizing said iSCSI protocol.

2. The method of claim 1, further comprising the steps of:

a) simultaneously calculating a CRC value for each possibility of said plurality of data blocks containing valid data; and b) selecting a correct calculated CRC value based on said number of said data blocks.

3. The method of claim 1, wherein sad calculated CRC values are variable between a value based on a data block single block up to a value based on a group of said data blocks.

4. The method of claim 1, wherein said data segment includes at least one data block.

5. A system for generating CRC values in a Data Transmission System having a data bus adapted for handling a plurality of data blocks in parallel, said plurality of data blocks comprising a data segment, said system comprising:

a) a memory for storing data blocks, said memory adapted to output a plurality of data blocks simultaneously;

b) a data bus, coupled to said memory, said data bus providing a data path wide enough to accommodate said plurality of data blocks;

c) a plurality of CRC cores coupled to said data bus; and d) a first multiplexer coupled to said CRC cores for selecting the output of one of said CRC cores based on a number of data blocks output on said data bus;

wherein a data segment is transmitted using an Internet small computer system interface (iSCSI) protocol;

wherein CRC values are calculated in accordance with a predetermined algorithm that accommodates said data segment transmitted using said iSCSI protocol, utilizing transport offload engine (TOE) including a physical data link that provides a physical connection to the Internet, a network stack in communication with said physical data link utilizing a TCP/IP protocol, a storage protocol services processor in communication with said network stack for exchanging data with said network stack, processing requests from a storage application, and encapsulating or decoding packets as requested by said storage application in accordance with said iSCSI protocol.

6. The system of claim 5, wherein said plurality of CRC cores includes a CRC core for calculating at least one CRC value for every combination of data blocks on said data bus.

7. The system of claim 5, further including a second multiplexer coupled to the output of said first multiplexer for initializing said CRC cores with a seed value for use in calculating said at least one CRC value.

8. The system of claim 7, where said at least one CRC value is based on said seed value and said data in said data blocks.

9. The system of claim 5, further including means for appending said at least one CRC value to said data segment.

10. The system of claim 5, wherein said at least one CRC value has the same granularity as said data blocks.

11. The system of claim 5, wherein said memory includes a non-volatile data storage device.

12. A circuit for calculating CRC values comprising:

a) a memory for storing data blocks, said memory including a plurality of outputs for simultaneously outputting data segments having a plurality of data blocks;

b) a data bus, coupled to said memory, said data bus having a data path for each of said data blocks;

c) a plurality of registers coupled to said data bus, said registers for temporarily storing data blocks within a data segment output from said memory, wherein said registers are adapted for storing any combination of data blocks within said data segment;

d) a plurality of CRC cores coupled to each of said respective registers, said CRC cores for calculating CRC values for said data blocks stored in each of said registers; and e) a multiplexer for selecting a CRC value calculated by one of said CRC cores, based on which of said plurality of registers contain valid data;

wherein said data segment is transmitted using an Internet small computer system interface (iSCSI) protocol;

wherein a plurality of CRC values are calculated in accordance with a predetermined algorithm that accommodates said data segment transmitted using said iSCSI protocol, utilizing a transport offload engine (TOE) including a physical data link that provides a physical connection to the Internet, a network stack in communication with said physical data link utilizing a TCP/IP protocol, a storage protocol services processor in communication with said network stack for exchanging data with said network stack, processing requests from a storage application, and encapsulating or decoding packets as requested by said storage application in accordance with said iSCSI protocol.

13. A method for calculating cyclical redundancy check (CRC) values, comprising:

receiving data;

calculating a CRC value in accordance with a predetermined algorithm that accommodates an Internet small computer system interface (iSCSI) protocol, utilizing a transport offload engine (TOE) including a physical data link that provides a physical connection to the Internet, a network stack in communication with said physical data link utilizing a TCP/IP protocol, a storage protocol services processor in communication with said network stack for exchanging data with said network stack, processing requests from a storage application, and encapsulating or decoding packets as requested by said storage application in accordance with said SCSI protocol;

appending said CRC value to said data; and transmitting said data utilizing said iSCSI protocol.

* * * * *